United States Patent
Yang et al.

(10) Patent No.: US 11,057,042 B2
(45) Date of Patent: Jul. 6, 2021

(54) DIGITAL TO ANALOG CONVERTER DEVICE AND CALIBRATION METHOD

(71) Applicant: Realtek Semiconductor Corporation, Hsinchu (TW)

(72) Inventors: Chih-Chieh Yang, Hsinchu (TW); Shih-Hsiung Huang, Miaoli County (TW); Liang-Huan Lei, Kaohsiung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/816,452

(22) Filed: Mar. 12, 2020

(65) Prior Publication Data

US 2021/0036711 A1 Feb. 4, 2021

(30) Foreign Application Priority Data

Jul. 31, 2019 (TW) ................................. 108127261

(51) Int. Cl.
| | |
|---|---|
| *H03M 1/10* | (2006.01) |
| *H03M 1/68* | (2006.01) |
| *H03M 1/06* | (2006.01) |
| *H03M 1/74* | (2006.01) |

(52) U.S. Cl.
CPC ....... *H03M 1/1009* (2013.01); *H03M 1/0607* (2013.01); *H03M 1/687* (2013.01); *H03M 1/742* (2013.01)

(58) Field of Classification Search
CPC .. H03M 1/1009; H03M 1/0607; H03M 1/687; H03M 1/742
See application file for complete search history.

(56) References Cited

U.S. PATENT DOCUMENTS

| | | | | | |
|---|---|---|---|---|---|
| 7,812,665 | B2 * | 10/2010 | Eschauzier | ......... | H03M 1/0692 330/9 |
| 10,587,279 | B1 * | 3/2020 | Yang | ....................... | H03M 1/06 |
| 10,715,163 | B2 * | 7/2020 | Chao | ................... | H03M 1/1033 |
| 10,855,301 | B2 * | 12/2020 | Zhou | ................... | H03M 1/1023 |

FOREIGN PATENT DOCUMENTS

CN 109995367 A 7/2019

OTHER PUBLICATIONS

Tomohiko Ogawa et al., "SAR ADC Algorithm with Redundancy and Digital Error Correction", IEICE Trans. Fundamentals, vol. E93-A, No. 2, pp. 415-423, 2010.
Meng-Hung Shen et al., "A Low Cost Calibrated DAC for High-Resolution Video Display System", IEEE Transactions on Very Large Scale Integration (VLSI) Systems, vol. 20, No. 9, 2012.

* cited by examiner

*Primary Examiner* — Brian K Young
(74) *Attorney, Agent, or Firm* — Locke Lord LLP; Tim Tingkang Xia Esq.

(57) ABSTRACT

A digital-to-analog converter (DAC) device includes a current-steering DAC circuitry and a calibration circuitry. The current-steering DAC circuitry generates a first signal according to multiple least significant bits of an input signal, and generates a second signal according to multiple most significant bits of the input signal. The calibration circuitry performs a non-binary search algorithm to generate a calibration signal in response to a comparison result of the first signal and the second signal, in order to calibrate the current-steering DAC circuitry according to the calibration signal.

16 Claims, 4 Drawing Sheets

400

| the DAC circuitry 120 generates the signal AO1 according to the LSB bits of the input signal SIN, and generates the signal AO2 according to the MSB bits of the input signal SIN | ～S410 |

↓

| in response to the comparison result of the signal AO1 and the signal AO2, the non-binary search algorithm is performed to generate the calibration signal S1, to calibrate the DAC circuitry 120 according to the calibration signal S1 | ～S420 |

FIG. 4

DIGITAL TO ANALOG CONVERTER DEVICE AND CALIBRATION METHOD

RELATED APPLICATIONS

This application claims priority to Taiwanese Application Serial Number 108127261, filed Jul. 31, 2019, which is herein incorporated by reference.

BACKGROUND

Technical Field

The present disclosure relates to a digital-to-analog converter (DAC) device. More particularly, the present disclosure relates to a current-steering DAC utilizing the non-binary algorithm during a calibration.

Description of Related Art

The digital-to-analog converters (DAC) are common in various electrical devices. In some related approaches, the DAC often utilizes a binary encoding method during a calibration. However, if an error occurs in internal circuits of the DAC during the calibration, the binary encoding method is unable to improve the error effectively.

SUMMARY

For resolving the aforementioned problems, one embodiment of the present disclosure is related to a digital-to-analog converter (DAC) device. The DAC device includes a current-steering DAC circuitry and a calibration circuitry. The current-steering DAC circuitry generates a first signal according to multiple least significant bits of an input signal, and generates a second signal according to multiple most significant bits of the input signal. The calibration circuitry performs a non-binary search algorithm to generate a calibration signal in response to a comparison result of the first signal and the second signal, in order to calibrate the current-steering DAC circuitry according to the calibration signal.

One embodiment of the present disclosure is related to a calibration method. The calibration method includes the following steps: generating a first signal according to multiple least significant bits of an input signal by a current-steering DAC circuitry, and generating a second signal according to multiple most significant bits of the input signal by the current-steering DAC circuitry; and in response to the first signal and the second signal, performing a non-binary search algorithm to generate a calibration signal, and calibrating the current-steering DAC circuitry according to the calibration signal.

As shown in the above embodiments, the DAC device and the calibration method of the present disclosure can utilize the non-binary search algorithm to calibrate the current-steering DAC, to increase overall reliability of the DAC device and save operation time of the calibration.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 4 is a flow diagram illustrating a calibration method according to some embodiments of the present disclosure.

DETAILED DESCRIPTION

Figure 1:
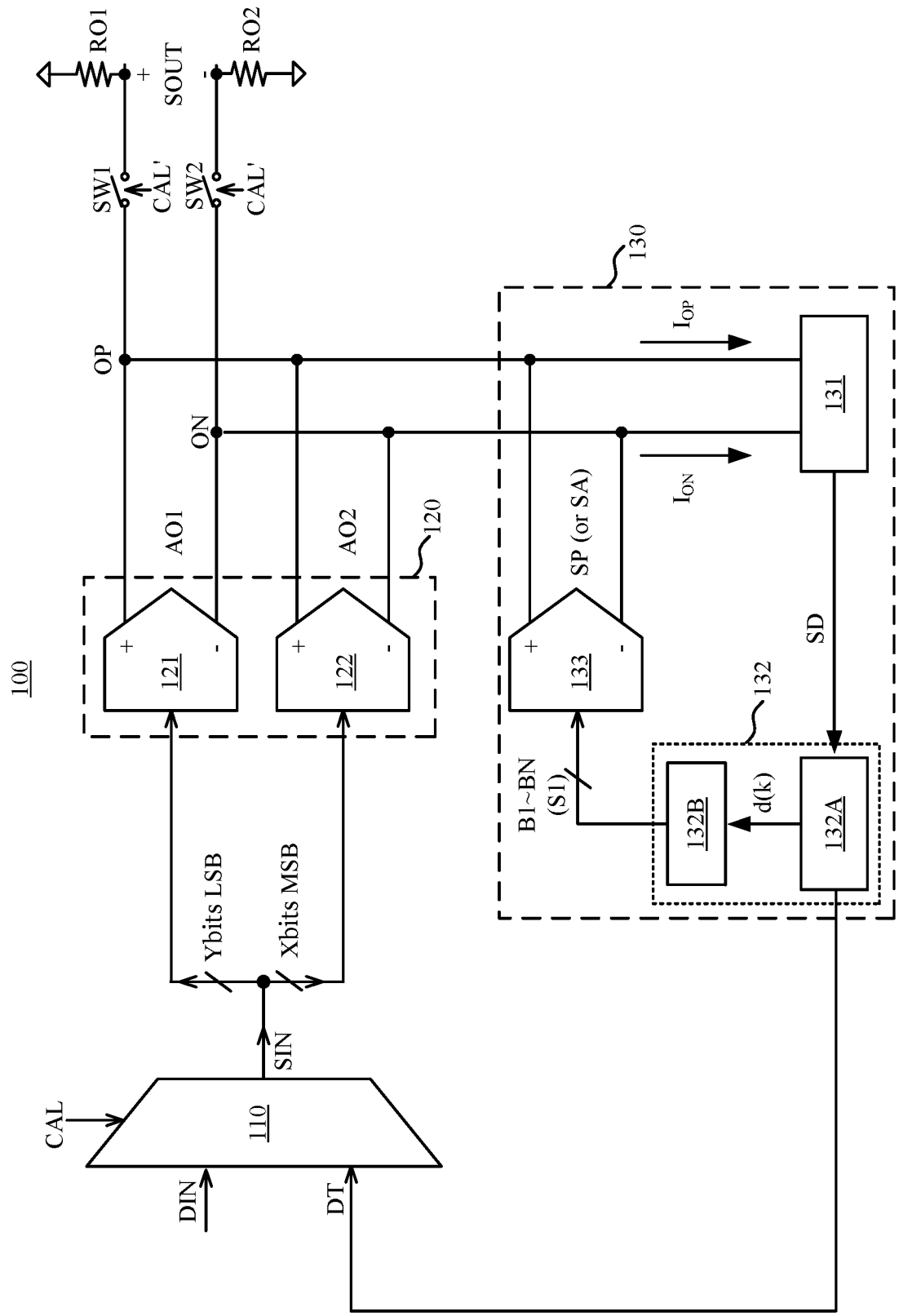
FIG. 1 is a schematic diagram illustrating a digital-to-analog converter (DAC) device according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. As used herein, the term "and/or" includes any and all combinations of one or more of the associated listed items.

In the present disclosure, "connected" or "coupled" may be referred to "electrically connected" or "electrically coupled." "Connected" or "coupled" may also be referred to operations or actions between two or more elements.

In the present disclosure, the term "circuitry" may indicate a system formed with one or more circuits. The term "circuit" may indicate an object, which is formed with one or more transistors and/or one or more active/passive elements based on a specific arrangement, for processing signals.

For ease of understanding, similar elements in each of figures are designated with the same reference numbers.

FIG. 1 is a schematic diagram illustrating a digital-to-analog converter (DAC) device 100 according to some embodiments of the present disclosure.

The DAC device 100 includes a multiplexer circuitry 110, a DAC circuitry 120, and a calibration circuitry 130. The multiplexer circuitry 110 outputs a data signal DIN or a test signal DT according to a mode control signal CAL, to be an input signal SIN. For example, when the mode control signal CAL has a logic value 0, the DAC device 100 operates in a normal mode, and the multiplexer circuitry 110 outputs the data signal DIN as the input signal SIN. Alternately, when the mode control signal CAL has a logic value 1, the DAC device 100 operates in a calibration mode, and the multiplexer circuitry 110 outputs the test signal DT as the input signal SIN.

The DAC circuitry 120 is coupled to the multiplexer circuitry 110, to receive the input signal SIN. The DAC circuitry 120 includes DAC circuits 121 and 122. The DAC circuit 121 generates a signal AO1 according to Y least significant bits (LSBs) of the input signal SIN. The DAC circuit 122 generates a signal AO2 according to X most significant bits (MSBs) of the input signal SIN.

In some embodiments, the X MSBs of the input signal SIN and/or X MSBs of the test signal DT may be replaced by a corresponding thermometer code, and the corresponding thermometer code has ($2^x$-1) bits.

In some embodiments, the DAC circuitry 120 is a current-steering DAC circuitry. The current-steering DAC circuitry may be implemented by current source circuits and be started up according to the input signal SIN, to output a corresponding current signal as the signal AO1 or AO2.

In some embodiments, the DAC device 100 further include resistors RO1-RO2 and switches SW1-SW2. The resistors RO1-RO2 are coupled to output terminals OP and ON of the DAC circuits 121 and 122 respectively, to convert the signals AO1 and AO2 into an analog output SOUT of a voltage form.

The switches SW1 and SW2 are coupled between output terminals of the DAC circuitry 120 and the resistors RO1-RO2 respectively. When operating in the calibration mode, the switches SW1 and SW2 are turned off in response to a mode control signal CAL', in which the mode control signal CAL' is a complementary signal of the mode control signal CAL. Thus, in the calibration mode, the signals AO1 and AO2 can be transmitted to the calibration circuitry 130 correctly. Alternatively, when operating in the normal mode, the switches SW1 and SW2 are turned on in response to the mode control signal CAL'. Thus, in the normal mode, the signals AO1-AO2 can be transmitted to the resistors RO1-RO2.

In some embodiments, the calibration circuitry 130 is coupled to the DAC circuitry 120, and calibrates the DAC circuit 122 based on the signals AO1 and AO2 in the calibration mode. In some embodiments, the calibration circuitry 130 includes a detector circuit 131, a digital controller circuit 132, and a DAC circuit 133.

The detector circuit 131 is coupled to the output terminals OP and ON of the DAC circuits 121-122, to receive the signals AO1 and AO2. In some embodiments, the detector circuit 131 compares the signals AO1 and AO2, to generate a detection signal SD. The detection signal SD is configured to indicate a comparison result of the signal AO1 and the signal AO2. In some embodiments, the detector circuit 131 is implemented by a current comparator and an equalizer, but the present disclosure is not limited thereto.

The digital controller circuit 132 is coupled to the multiplexer circuitry 110 and the detector circuit 131. In some embodiments, a memory (not shown) is configured in the digital controller circuit 132, and the memory is configured to store the preset test signal DT, to provide the test signal DT to the multiplexer circuitry 110 in the calibration mode. In some embodiments, the digital controller circuit 132 performs a calibration operation in response to the detection signal SD, to generate a calibration signal S1.

For example, the digital controller circuit 132 may perform a non-binary search algorithm according to the detection signal SD, to determine bits B1-BN of the calibration signal S1. In some embodiments, the digital controller circuit 132 includes a calibration circuit 132A and a codec circuit 132B. The calibration circuit 132A performs the non-binary search algorithm, to generate a bit d(k), in which k is 1, 2, . . . , M. The codec circuit 132B is configured to perform an encoding (or decoding) operation according to the bit d(k), to generate the bits B1-BN. In some embodiments, the digital controller circuit 132 may be implemented by an adder and a register, to perform the non-binary search algorithm.

The DAC circuit 133 is coupled to the DAC circuit 122 and the digital controller circuit 132. In the calibration mode, the DAC circuit 133 outputs an adjustment signal SA according to the calibration signal S1. After the calibration mode is finished, the bits B1-BN of the calibration signal S1 are determined, such that the DAC device 100 uses the bits B1-BN of the calibration signal S1 in the normal mode.

In some embodiments, in the normal mode, the DAC circuit 133 outputs a compensation signal SP according to the determined calibration signal S1, to calibrate the DAC circuit 122. For example, if the DAC circuit 122 is a current-steering DAC implemented by unit current sources, the compensation signal SP may be inputted to the DAC circuit 122, to modify a bias voltage of a corresponding unit current source. Therefore, the signal AO2 outputted by the DAC circuit 122 can be calibrated equivalently.

Alternately, as illustrated in FIG. 1, in some embodiments, the DAC circuit 133 is directly coupled to an output of the DAC circuit 122. In this configuration, the DAC circuit 133 can turn on the corresponding internal current source circuits according to the calibration signal S1, to generate a corresponding current signal, i.e., the compensation signal SP, to the output terminals OP and ON of the DAC circuit 122. Thus, the compensation signal SP and the signal AO2 can be summed up directly, to modify an offset of the DAC circuit 122 equivalently.

In some embodiments, the calibration signal S1 outputted from the DAC circuit 133 may be stored in a memory. In the normal mode, when the MSBs (for example, a current source circuit 122A) are turned on, the calibration signals S1 corresponding to the MSBs can be summed up, to control the DAC circuit 133.

Figure 2:
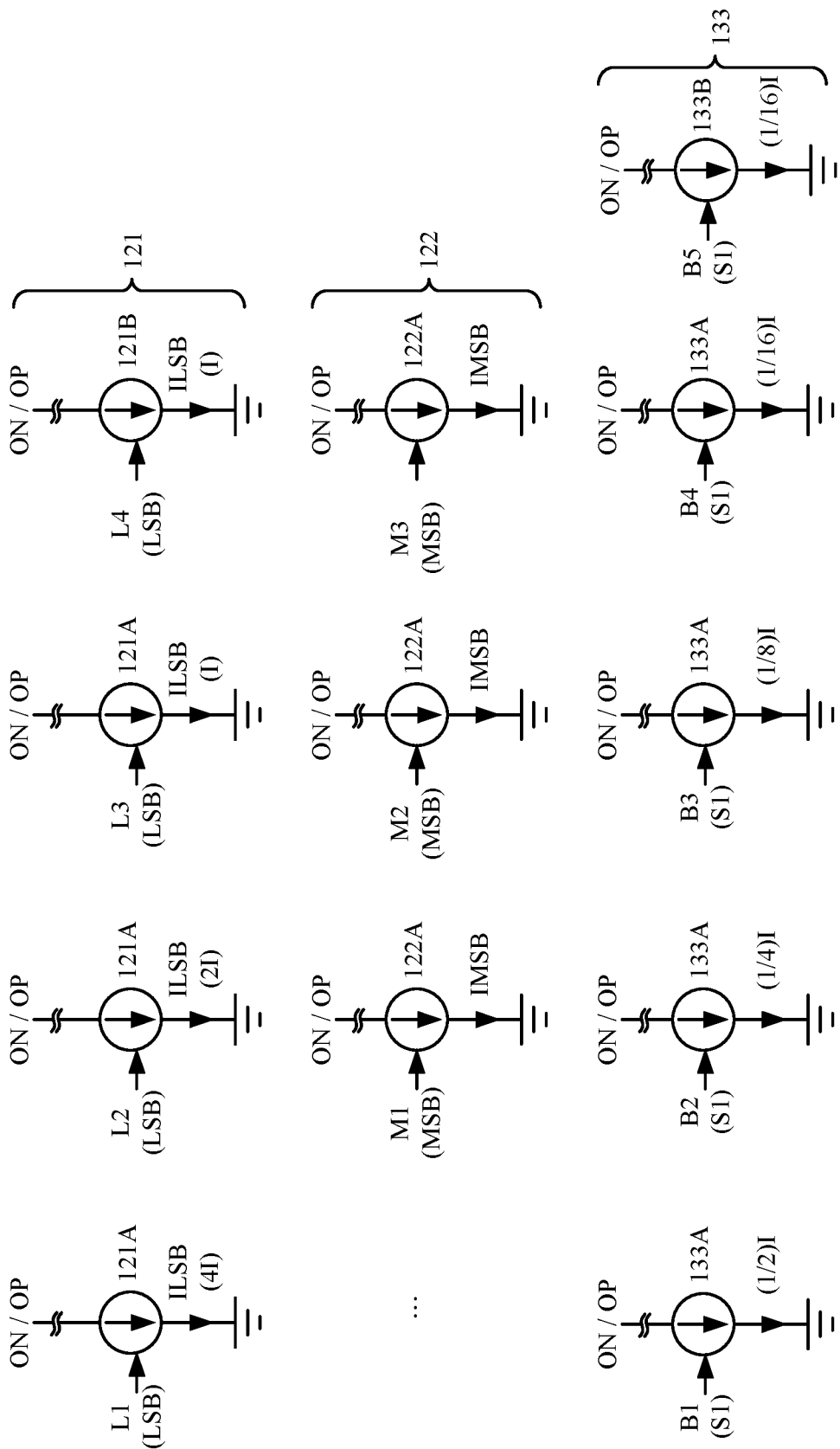
FIG. 2 is a schematic diagram illustrating current source circuits of DAC circuits in FIG. 1 according to some embodiments of the present disclosure.

FIG. 2 is a schematic diagram illustrating current source circuits of the DAC circuits 121, 122, and 133 in FIG. 1 according to some embodiments of the present disclosure.

In some embodiments, the DAC circuits 121, 122, and 133 may be implemented by a current-steering DAC circuit. In this example, Y is equal to 3. That is, current source circuits 121A are controlled by LSB bits L1-L3 respectively. In this example, X is equal to 2, corresponding to M1-M3 (such as, thermometer code). That is, current source circuits 122A are controlled by the MSB bits M1-M3 respectively. In this example, N is equal to 4. That is, current source circuits 133A are controlled by the bits B1-BN of the calibration signal S1 respectively.

For example, if LSB is encoded by a binary code and MSB is encode by the thermometer code, one current of the currents (hereafter currents ILSB) of the current source circuits 121A is twice as much as another current of the currents sequentially. For example, as illustrated in FIG. 2, one current of the currents of the current source circuits 121A (as the current source circuits 121A corresponding to the bits L1-L3) is twice as much as another current of the currents sequentially. As illustrated in FIG. 2, the DAC circuit 133 includes the current source circuits 133A, and one current is twice as much as another current sequentially (for example, (½)I, (¼)I, and (⅛)I etc.). In some embodiments, a resolution of the DAC circuit 133 is higher than that of the DAC circuit 122.

Ideally, a sum of the currents ILSB is equal to a current (hereafter a current IMSB) of a single current source circuit 122A. That is, ΣILSB=IMSB (hereafter known as a formula (1)). However, due to manufacturing process variation and/or circuit offsets, the current IMSB has offsets, such that the formula (1) is not satisfied. In some embodiments, the DAC circuit 121 further includes an additional current source circuit 121B. A current of the current source circuit 121B is I, and is controlled by a bit L4. In this condition, ideally, ΣILSB=IMSB. In some embodiments, the DAC circuit 133 further includes an additional current source circuit 133B. A current of the current source circuit 133B is I/16 and is set to be controlled by an additional bit B5 of the calibration signal S1.

Thus, in the calibration mode, the digital controller circuit 132 can output the test signal DT having specific bit values. For a first testing, low weighting bits (for example, the LSB bits L1-L3 and the bit L4) of the test signal DT are 1, and a corresponding one of high weighting bits (for example, thermometer code M1-M3 corresponding to the MSB) of the test signal DT is 0. In this condition, all of the current source circuits 121A are turned on to output all the currents ILSB to an output terminal (for example, the output terminal ON), and one corresponding current source circuit 122A is turned on to output the single current IMSB to another output terminal (for example, the output terminal OP). With this configuration, the detector circuit 131 can compare the sum of the currents ILSB and the current IMSB corresponding and outputted from the current source circuit 122A, to determine whether the formula (1) is satisfied or not. If the formula (1) is not satisfied, the detector circuit 131 can output the corresponding detection signal SD.

In some embodiments, one half of other high weighting bits except for the corresponding one (the thermometer code of the corresponding one) of the test signal DT is 0, and another half is 1, such that residual current source circuits 122A are assigned at the two output terminals evenly. In some embodiments, error, introduced from the residual current source circuits 122A assigned evenly, may be calibrated by changing the output terminals and a corresponding algorithm. Since the mentioned error is not a key of the present disclosure, it is assumed that there is no error when the residual current source circuits 122A are assigned evenly in the present disclosure.

In some embodiments, the digital controller circuit 132 may perform the non-binary search algorithm in response to the detection signal SD to determine the bit d(1). Then, at least of the current source circuits 133A outputs the adjustment signal SA according to the bit d(1), to adjust the signal AO2. The detector circuit 131 may compare the signal AO1 and the signal generated by adjusting the signal AO2 with the adjustment signal SA, to generate the detection signal SD of a next step. By the same operations, the digital controller circuit 132 can determine the second bit d(2). With this analogy, the detection signal SD is updated gradually, and the bits B1-BN of the calibration signal S1 can be determined. The at least one of the current source current circuits 133A is turned on according to the bits B1-BN, to output the corresponding current as the compensation signal SP.

In some embodiments, during determining the bit d(k), the signal AO1 is equivalent to the current $I_{ON}$ described below, and the signal generated by adjusting the signal AO2 with the adjustment signal SA is equivalent to the current $I_{OP}$ described below.

In some embodiments, the compensation signal SP and the signal AO2 may be summed up directly, to calibrate the DAC circuit 122 equivalently (as illustrated in FIG. 1). In other words, the formula (1) may be modified as ΣILSB=IMSB+ISP (hereafter the formula (2)), in which ISP is the compensation signal SP corresponding to a voltage difference between the two output terminals OP and ON, and is configured to compensate the IMSB, such that IMSB+ISP is equal to ΣILSB. Thus, by performing the operations one or more time, the digital controller circuit 132 can determine the offset required to be modified of the single current source circuit 133A, and record the corresponding calibration signal S1 to the memory (not shown) of the digital controller circuit 132.

When the compensation signal SP corresponding to one of the current source circuits 122A is recorded, the digital controller circuit 132 can update a next one of the thermometer code corresponding to the MSBs of the test signal DT to be 1, and perform aforementioned operations. With this analogy, the digital controller circuit 132 can records all the calibration signal S1 corresponding to all the current source circuits 122A by a look-up table or other methods. Thus, in the normal mode, when one current source circuit 122A is started up, the digital controller circuit 132 can output the corresponding calibration signal S1, to control the DAC circuit 133 to output the compensation signal SP.

With different signal forms, the detector circuit 131 may adopt different circuits to determine whether the aforementioned formula (2) is satisfied or not. For example, when the aforementioned signals are current signals, the detector circuit 131 may be implemented by current comparators and switching circuits. In some embodiments, the switching circuits may be configured to change transmission paths of current signals corresponding to the signals AO1-AO2, to let the current comparators acquire enough information to determine whether the formula (2) is satisfied or not.

The operations of the calibration circuit 132A are described in following paragraphs. In some embodiments, the number values of the bits of the DAC circuit 133 is N, the number values of the conversion step is M, in which N is less or equal to M, and the offset is OFFSET. That is, OFFSET=ΣILSB-IMSB. In this condition, the offset OFFSET is compensated according to the adjustment signal SA (k) generated by the non-binary search algorithm shown below.

$$\begin{cases} SA(k) = 2^{N-1} + \sum_{i=2}^{k} s(i-1) \times p(i) & \text{formula(3)} \\ s(k) = \begin{cases} 1, \text{when } d(k) = 1 \\ -1, \text{when } d(k) = 0 \end{cases} \\ d(k) = \begin{cases} 1, \text{when } I_{ON} > I_{OP} \\ 0, \text{other conditions} \end{cases} \end{cases}$$

The adjustment signal SA (k) is a signal level corresponding to a current outputted at the output terminal OP of the DAC circuit 133 (if it is corresponded to FIG. 2, the unit is (1/16)I). Currents $I_{OP}$ and $I_{ON}$ are the currents from the output terminals OP and ON flowing into the detector circuit 131, in which k=1, 2, . . . and M, and s(k) is a variable determined by the bit d(k), and p(k) is a number value added to the adjustment signal SA(k-1), or a number value subtracted from the adjustment signal SA(k-1).

In some embodiments, the non-binary search algorithm may be designed to have a redundancy range q(k). The redundancy range q(k) may be configured to tolerate decision mistake in the (k)th conversion step of the detector circuit 131. In some embodiments, the redundancy range q(k) satisfies the following formula (4):

$$2^M - 2^N = \sum_{i=1}^{M-1} 2^i q(i) + 2 \times (\text{over range}) \quad \text{formula(4)}$$

In some embodiments, over range is an exceeded signal level range compared to performing the non-binary algorithm.

According to the formula (3) and the formula (4), it is derived that the value of p(k) satisfies the formula (5):

$$p(k+1) = -q(k) + 2^{M-k-1} - \sum_{i=k+1}^{M-1} 2^{i-k-1} q(i) \quad \text{formula(5)}$$

In some embodiments, the calibration circuit 132A may generate bits d(k) according to the aforementioned formulas (3)-(5) sequentially. In some embodiments, the calibration circuit 132A may be implemented by a digital signal processing circuit, one or more logic circuits, and/or a processing circuit performing the finite-state machine (FSM), but the present disclosure is not limited thereto.

Figure 3:
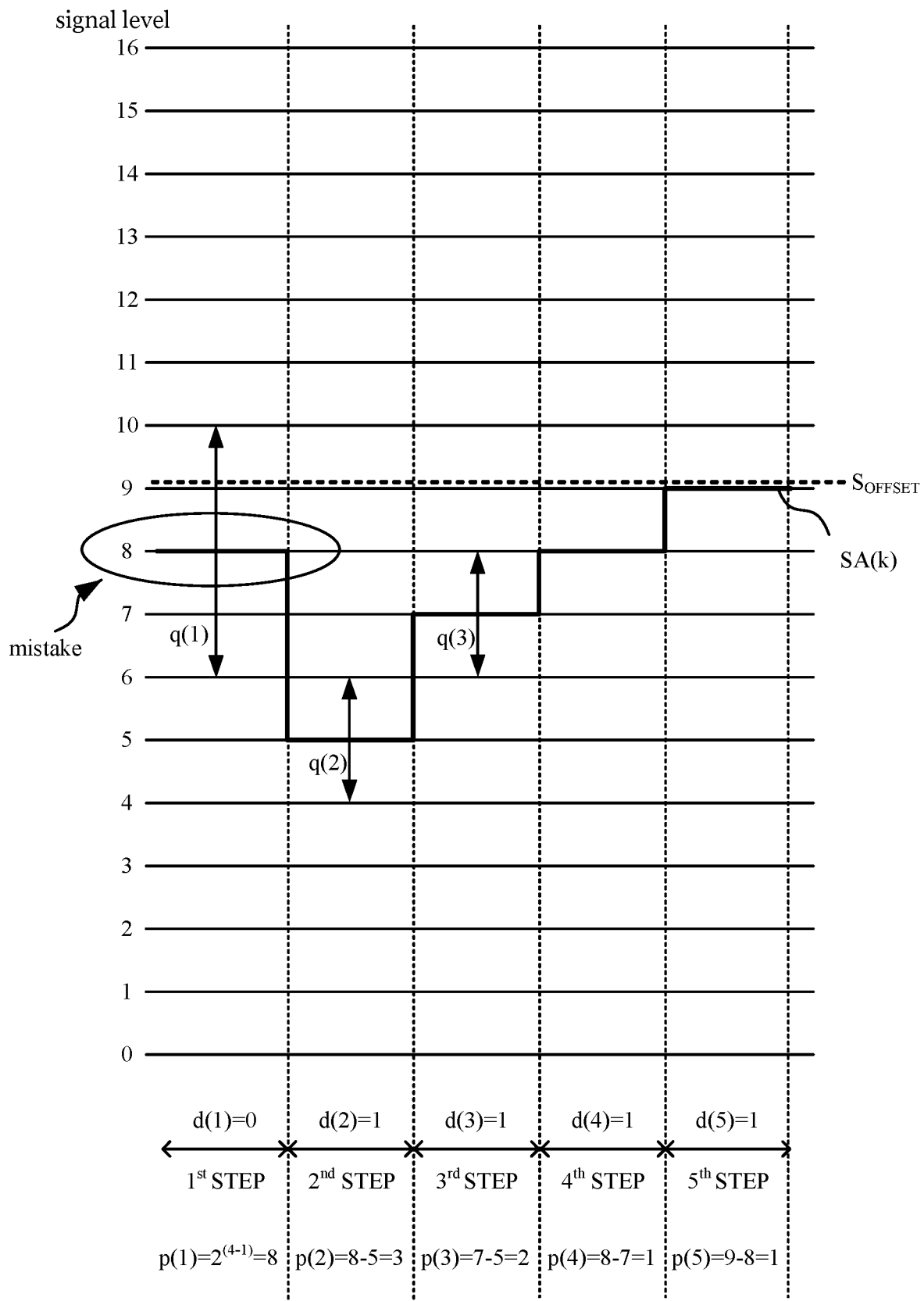
FIG. 3 is a schematic diagram illustrating operations of a non-binary search algorithm according to some embodiments of the present disclosure.

FIG. 3 is a schematic diagram illustrating operations of the non-binary search algorithm according to some embodiments of the present disclosure.

In this example, the over range is set to be 0, the total signal level is 16, N is 4, M is 5, and the redundancy ranges q(1)-q(3) corresponding to three conversion steps at the front are set to be 2, 1, 1 respectively. It is assumed that a signal level $S_{OFFSET}$ of the offset OFFSET corresponding to the output terminal OP is about 9, in which the signal level $S_{OFFSET}$ corresponding to the offset OFFSET makes IMSB+OFFSET=ΣILSB. In the first step, the adjustment signal SA(k) is 8 (based on the formula (3), that is $2^{(4-1)}$). The current $I_{ON}$ is greater than the current $I_{OP}$, and the calibration circuit 132A should determine the corresponding bit d(1) to be 1. However, in this example, the detector circuit 131 makes an error, and it results in that the calibration circuit 132A determines the corresponding bit d(1) to be 0 by mistake.

Then, in the second step, the calibration circuit 132A adjusts the adjustment signal SA according to the formula (3) and the formula (5), to adjust the adjustment signal SA(k) to be 5. The signal level $S_{OFFSET}$ is greater than the adjustment signal SA(k), so the calibration circuit 132A determines that the corresponding bit d(2) to be 1. With this analogy, after finishing 5 times conversion steps, the calibration circuit 132A generates the bits d(1)-d(5) which sequentially are 01111.

In some embodiments, the bits d(1)-d(5) may be encoded to be a multi-level digital code, to control the DAC circuit 133 to generate the required adjustment signal SA, but the present disclosure is not limited thereto.

In some embodiments, the digital code Dout corresponding to the output terminal OP of the adjustment signal SA satisfies the following formula (6):

$$Dout = 2^{N-1} + \sum_{i=2}^{M-1} s(1-i)p(i) + \frac{1}{2}(s(M) - 1) \quad \text{formula(6)}$$

In this example, N is 4, M is 5, and the aforementioned formula (6) may be expanded as the formula (7):

$$Dout = \quad \text{formula(7)}$$
$$2^3 + p(2)D_1 + p(3)D_2 + p(4)D_3 + p(5)D_4 + 0.5D_5 - 0.5$$

$$\text{in which } D_i = \begin{cases} +1, \text{ when } d(i) = 1 \\ -1, \text{ when } d(i) = 0 \end{cases}$$

D1-D5 are variable numbers determined by the bit d(k). As illustrated in FIG. 3, according to the formula (7), in this example, the digital code Dout is equal to 8−3+2+1+1+0.5−0.5=9, corresponding to the signal level $S_{OFFSET}$. In other words, in the embodiments of the present disclosure, by performing the non-binary search algorithm, the calibration circuit 132A can tolerate some errors of the detector circuit 131. Thus, operation reliability of the DAC device 100 can be increased.

In some related approaches, the calibration of the current-steering DAC is performed by the binary search algorithm. In these approaches, when there is an error in the comparator circuit of the current-steering DAC, it would lead to failure and reduce conversion accuracy rate of the current-steering DAC. In addition, in some applications, more comparisons are performed to increase calibration accuracy for reducing errors. Thus, more processing time is consumed for the calibration.

Compared with these related approaches, as described above, the calibration circuit 132A of the embodiments of the present disclosure can tolerate some errors of the detector circuit 131. Thus, overall accuracy of the DAC circuit 100 can be increased. In addition, by setting the aforementioned redundancy range q(k), the calibration circuit 132A can tolerate the comparison error such that multiple comparisons can be omitted. Thus, processing time can be reduced.

In some embodiments, the codec circuit 132B may convert the bits d(1)-d(5) into the bits B1-BN of the calibration signal S1. For example, the codec circuit 132B may convert "01111" (that is, the bits d(1)-d(5), non-binary) into "1001" (that is, the bits B1-BN, binary).

The aforementioned bit values and the aforementioned setting methods for setting the circuits are configured for illustration, and various bit values and various setting methods for setting the circuits are within the scope of the present disclosure.

FIG. 4 is a flow diagram illustrating a calibration method 400 according to some embodiments of the present disclosure. In some embodiments, the calibration method 400 may be performed by the DAC device 100 in FIG. 1.

In operation S410, the DAC circuitry 120 generates the signal AO1 according to the LSB bits of the input signal SIN, and generates the signal AO2 according to the MSB bits of the input signal SIN.

In operation S420, in response to the comparison result of the signal AO1 and the signal AO2, the non-binary search algorithm is performed to generate the calibration signal S1, so as to calibrate the DAC circuitry 120 according to the calibration signal S1.

The aforementioned operations may be referred to the embodiments in FIG. 1-FIG. 3, so it is not described herein. The above description of the calibration method 400 includes exemplary operations, but the operations of the calibration method 400 are not necessarily performed in the order described. The order of the operations of the calibration method 400 disclosed in the present disclosure are able to be changed, or the operations are able to be executed simultaneously or partially simultaneously as appropriate, in accordance with the spirit and scope of various embodiments of the present disclosure.

As shown in the above embodiments, the DAC device and the calibration method of the present disclosure can utilize the non-binary search algorithm to calibrate the current-steering DAC, to increase overall reliability of the DAC device and reduce operation time of the calibration.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A digital-to-analog converter (DAC) device comprising:
   a current-steering DAC circuitry configured to generate a first signal according to a plurality of least significant bits of an input signal, and generate a second signal according to a plurality of most significant bits of the input signal; and
   a calibration circuitry configured to perform a non-binary search algorithm to generate a calibration signal in response to a comparison result of the first signal and the second signal, in order to calibrate the current-steering DAC circuitry according to the calibration signal.

2. The DAC device of claim 1, wherein the calibration circuitry comprises:
   a digital controller circuit configured to perform the non-binary search algorithm according to a detection signal to generate a plurality of first bits, and generate a plurality of second bits of the calibration signal according to the plurality of first bits, wherein the detection signal is configured to indicate the comparison result.

3. The DAC device of claim 2, wherein the digital controller circuit comprises:
   a calibration circuit configured to perform the non-binary search algorithm according to the detection signal to generate the plurality of first bits; and
   a codec circuit configured to convert the plurality of first bits to be the plurality of second bits.

4. The DAC device of claim 2, wherein the calibration circuitry further comprises:
   a detector circuit configured to compare the first signal and the second signal, to generate the detection signal; and
   a digital-to-analog converter circuit configured to generate a compensation signal according to the plurality of second bits of the calibration signal, to calibrate the current-steering DAC circuitry.

5. The DAC device of claim 4, wherein the DAC circuit is further configured to generate an adjustment signal according to the plurality of first bits to adjust the second signal, and the detector circuit is further configured to compare the first signal and the adjusted second signal, to update the detection signal.

6. The DAC device of claim 4, wherein the non-binary search algorithm sets a redundancy range to at least one bit of the plurality of first bits, to tolerate a mistake of the detector circuit.

7. The DAC device of claim 1, wherein the current-steering DAC circuitry comprises:
   a first DAC circuit configured generate the first signal according to the plurality of least significant bits; and
   a second DAC circuit configured generate the second signal according to the plurality of most significant bits.

8. The DAC device of claim 7, wherein each of the first DAC circuit and the second DAC circuit is implemented by a current-steering DAC circuit.

9. A calibration method suitable for a current-steering DAC circuitry, wherein the calibration method comprises:
   generating a first signal according to a plurality of least significant bits of an input signal by the current-steering DAC circuitry, and generating a second signal according to a plurality of most significant bits of the input signal by the current-steering DAC circuitry; and
   in response to the first signal and the second signal, performing a non-binary search algorithm to generate a calibration signal, and calibrating the current-steering DAC circuitry according to the calibration signal.

10. The calibration method of claim 9, wherein in response to a comparison result of the first signal and the second signal, performing the non-binary search algorithm to generate the calibration signal comprises:
    performing the non-binary search algorithm according to a detection signal to generate a plurality of first bits, wherein the detection signal is configured to indicate the comparison result; and
    generating a plurality of second bits of the calibration signal according to the plurality of the first bits.

11. The calibration method of claim 10, wherein generating the plurality of second bits of the calibration signal according to the plurality of first bits comprises:
    performing an encoding/decoding operation to the plurality of first bits, to generate the plurality of second bits.

12. The calibration method of claim 10 further comprising:
    comparing the first signal and the second signal by a detector circuit, to generate the detection signal; and
    generating a compensation signal according to the plurality of second bits of the calibration signal by a DAC circuit, to calibrate the current-steering DAC circuitry.

13. The calibration method of claim 12, wherein the DAC circuit is further configured to generate an adjustment signal according to the plurality of first bits to adjust the second signal, and the detector circuit is configured to compare the first signal and the adjusted second signal, to update the detection signal.

14. The calibration method of claim 12, wherein the non-binary search algorithm sets a redundancy range to at least one bit of the plurality of first bits, to tolerate a mistake of the detector circuit.

15. The calibration method of claim 9, wherein generating the first signal according to the plurality of least significant bits of the input signal by the current-steering DAC circuitry, and generating the second signal according to the plurality of most significant bits of the input signal by the current-steering DAC circuitry comprises:
    generating the first signal according to the plurality of least significant bits by a first DAC circuit; and
    generating the second signal according to the plurality of most significant bits by a second DAC circuit.

16. The calibration method of claim 15, wherein the each of the first DAC circuit and the second DAC circuit is implemented by a current-steering DAC circuit.

* * * * *